US008426299B2

(12) United States Patent
Kim et al.

(10) Patent No.: US 8,426,299 B2
(45) Date of Patent: Apr. 23, 2013

(54) METHOD OF MANUFACTURING SEMICONDUCTOR DEVICE

(75) Inventors: Joon-Sung Kim, Seoul (KR); Hye-Soo Shin, Seoul (KR); Mi-Youn Kim, Seongnam-si (KR); Young-Soo Kim, Seoul (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 0 days.

(21) Appl. No.: 13/337,748

(22) Filed: Dec. 27, 2011

(65) Prior Publication Data
US 2012/0164821 A1 Jun. 28, 2012

(30) Foreign Application Priority Data
Dec. 28, 2010 (KR) .................. 10-2010-0137056

(51) Int. Cl.
*H01L 21/4763* (2006.01)
(52) U.S. Cl.
USPC ........... 438/585; 438/593; 438/622; 438/640; 438/738; 257/E21.575
(58) Field of Classification Search ........... 438/588, 438/585, 593, 622, 669, 737–738, 640; 257/E21.575
See application file for complete search history.

(56) References Cited

U.S. PATENT DOCUMENTS

| 5,670,062 | A  | * | 9/1997 | Lin et al. ..................... 216/108 |
| 6,559,048 | B1 | * | 5/2003 | Kim et al. .................... 438/637 |
| 6,913,705 | B2 | * | 7/2005 | Nakata ........................ 216/24 |
| 7,947,538 | B2 | * | 5/2011 | Ohnuma et al. ............. 438/149 |

FOREIGN PATENT DOCUMENTS

| JP | 5-37007 | 2/1993 |
| KR | 10-2002-0000047 | 1/2002 |
| KR | 10-2009-0097725 | 9/2009 |
| KR | 10-2009-0122274 | 11/2009 |

* cited by examiner

*Primary Examiner* — Michael Trinh
(74) *Attorney, Agent, or Firm* — Stanzione & Kim, LLP

(57) ABSTRACT

A method of fabricating a semiconductor device may include: alternatively stacking dielectric layers and conductive layers on a substrate to form a stack structure, forming a first photoresist pattern on the stack structure, forming a second photoresist pattern whose thickness is reduced as the second photoresist pattern extends from the center of the stack structure towards a periphery of the stacked structure by performing a heat treatment on the first photoresist pattern, etching the stack structure through the second photoresist pattern to form a slope profile on the stack structure whose thickness is reduced as the slope profile extends from the center of the stack structure towards a periphery of the stacked structure, and forming a step-type profile on the end part of the stack structure by selectively etching the dielectric layer.

20 Claims, 9 Drawing Sheets

METHOD OF MANUFACTURING SEMICONDUCTOR DEVICE

CROSS-REFERENCE TO RELATED APPLICATIONS

This application claims priority from Korean Patent Application No. 10-2010-0137056, filed on Dec. 28, 2010 in the Korean Intellectual Property Office, the disclosure of which is incorporated herein by reference in its entirety.

BACKGROUND

1. Field

The present general inventive concept relates to a fabricating method of a semiconductor device.

2. Description of the Related Art

An increase in integration of semiconductor memory device has been in demand to meet the market requirements for higher performance and reduced cost. In particular, increased integration is required because the degree of integration of semiconductor memory devices can be an important factor in determining the product price. In the case of the conventional 2-dimensional or plane semiconductor memory devices, the degree of integration is mainly determined by the area occupied by unit memory cell. As a result, fine pattern formation technology plays a great role in the degree of integration.

However, since high cost equipment is required for forming fine patterns, the degree of integration of 2-dimensional semiconductor memory device has been limited although it has been increasing. To overcome this limitation, vertical cell string structure that forms memory cells in 3 dimensions has been researched. With vertical cell string structure, the end part of the semiconductor device must be formed to have a step shape so as to form contact parts configured to connect the vertical cell string and the signal interconnect.

SUMMARY

The present general inventive concept provides a fabricating method of a semiconductor that can form a step style end part using a simple and easy process.

Additional features and utilities of the present general inventive concept will be set forth in part in the description which follows and, in part, will be obvious from the description, or may be learned by practice of the general inventive concept.

Exemplary embodiments of the present general inventive concept provide a method of fabricating a semiconductor device that may include: alternately stacking a plurality of dielectric layers and a plurality of conductive layers on a substrate to form a stack structure, forming a first photoresist pattern on the stack structure, forming a second photoresist pattern whose thickness is reduced as the second photoresist pattern extends from the center of the stack structure towards a periphery of the stacked structure by performing a heat treatment on the first photoresist pattern, etching the stack structure through the second photoresist pattern to form a slope profile on the stack structure whose thickness is reduced as the slope profile extends from the center of the stack structure towards the periphery of the stacked structure, and forming a step type profile on the end part of the stack structure by selectively etching the dielectric layer.

The method may further include forming a passivation layer on the stack structure and forming a plurality of contact holes in the passivation layer to expose the end parts of the plurality of conductive layers. Further, the method may also include forming metal interconnections in each of the plurality of contact holes to provide electrical connections to the plurality of conductive layers.

The thickness at the center of the second photoresist pattern may be substantially equal to a thickness of the stack structure.

Further, an etch selectivity of the plurality of dielectric layers may be different from an etch selectivity of the plurality of conductive layers.

Exemplary embodiments of the present general inventive concept may also provide a method of fabricating a semiconductor device that includes: alternately stacking a plurality of dielectric layers and a plurality of sacrificial layers on a semiconductor substrate to form a mold structure, forming a multi-cell transistor which is connected vertically in the mold structure, forming a first photoresist pattern on the mold structure, forming a second photoresist pattern whose thickness is reduced as the second photoresist pattern extends from the center of the mold structure to a periphery of the mold structure by performing a heat treatment on the first photoresist pattern, etching the mold structure through the second photoresist pattern to form a slope profile on the mold structure whose thickness is reduced as the slop profile extends from the center of the mold structure towards the periphery of the mold structure, and forming a step-type profile along the periphery of the mold structure by selectively etching the dielectric layer.

The formation of the cell transistor may include: forming a plurality of semiconductor patterns that penetrate the mold structure and extend in a vertical direction to the semiconductor substrate; and forming a plurality of gate electrodes that each contact the plurality of semiconductor patterns and that are stacked in the vertical direction to the semiconductor substrate. Additionally, in this case, the formation of the plurality of semiconductor patterns may include forming a first open area that penetrates the mold structure and filling the first open area with a single crystal silicon. Further, the formation of the gate electrodes may include: forming a second open area which exposes a part of the mold structure between the plurality of semiconductor patterns; forming a plurality of hollow portions which expose a side of each of the plurality of semiconductor patterns by removing the plurality of sacrificial layers having been exposed by the second open area; forming a conductive layer that fills the second open area and the plurality of hollow portions; and forming a third open area by removing the conductive layer disposed within the second open area. Also, the semiconductor device may be a vertical nonvolatile memory device.

The method may further include: forming a passivation layer on the mold structure; forming a plurality of contact holes in the passivation layer that respectively connect to each of the plurality of gate electrodes; and forming metal interconnections in each of the plurality of contact holes. In this case, the plurality of contact holes may expose an end part of each of the plurality of gate electrodes.

The method may further include forming a charge storage layer along surfaces of each of the plurality of dielectric layers exposed by the removal of the plurality of sacrificial layers and along the side of each of the plurality of semiconductor patterns exposed by the plurality of hollow portions prior to the formation of the conductive layer.

Exemplary embodiments of the present general inventive concept may also provide a method of fabricating a semiconductor device that includes: alternately stacking a plurality of dielectric layers and a plurality of sacrificial layers on a semiconductor substrate to form a mold structure; forming a plurality of semiconductor patterns that penetrate the mold structure and extend in a vertical direction to the semiconductor substrate; forming a plurality of word lines that each contact the plurality of semiconductor patterns and that are stacked in a vertical direction to the semiconductor substrate and extend to a first direction; forming a first photoresist pattern on the mold structure; forming a second photoresist pattern whose thickness is reduced as the second photoresist pattern extends from the center of the mold structure to a periphery of the mold structure by performing a heat treatment on the first photoresist pattern; to forming the mold structure including a slope profile whose thickness is reduced toward the end part from the center by etching the mold structure through the second photoresist pattern; forming a step-type profile along the periphery of the mold structure by selectively etching the dielectric layer; forming a passivation layer on the mold structure; and forming a plurality of contact holes in the passivation layer to expose end parts of each of plurality of word lines.

Exemplary embodiments of the present general inventive concept may also provide a method of fabricating a semiconductor device that includes forming a dielectric layer and a conductive layer on a substrate to form a stack structure; forming a first photoresist pattern on the stack structure; performing a heat treatment on the first photoresist pattern; etching the stack structure through the heat treated first photoresist pattern to form a slope profile on the stack structure having a thickness that decreases as the slope profile extends outward from a center of the stack structure towards a periphery of the stacked structure; and forming a step-type profile along the periphery of the stack structure by selectively etching the dielectric layer.

The heat treated first photoresist pattern may have a thickness that decreases as a distance from a center of the heat treated first photoresist pattern increases.

Further, the heat treated first photoresist pattern may contact a greater surface area of the stack structure than the untreated first photoresist pattern. That is, the first photoresist pattern may expand outward during the heat treatment process. Further, the heat treated first photoresist pattern may have a dome shape.

The dielectric layer may include a plurality of dielectric layers and the conductive layer may include a plurality of conductive layers. In this case, the plurality of dielectric layers and the plurality of conductive layers may be alternately stacked on the substrate to form the stack structure.

Further, an end portion of the conductive layer may be exposed by the formation of the step-type profile.

The method may further include forming a passivation layer on the stack structure and forming a contact hole in the passivation layer to expose the end portion of the conductive layer.

The method may further include forming a metal interconnection within the contact hole to provide an electrical connection to the conductive layer.

Further, a thickness at the center of the heat treated first photoresist pattern may be substantially equal to a thickness of the stack structure.

Additionally, an etch selectivity of the dielectric layer may be different from an etch selectivity of the conductive layer.

BRIEF DESCRIPTION OF THE DRAWINGS

The above and other features and utilities of the present general inventive concept will become apparent by describing in detail exemplary embodiments thereof with reference to the attached drawings in which.

DETAILED DESCRIPTION OF THE EXEMPLARY EMBODIMENTS

Figure 1:
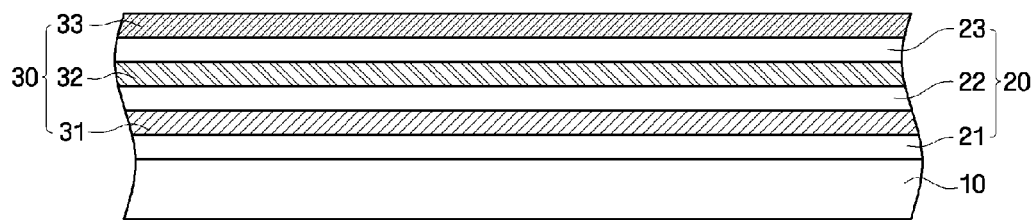
FIGS. 1 through 8 are sectional views sequentially illustrating a fabricating method of a semiconductor device according to an exemplary embodiment of the present general inventive concept.

Features and utilities of the present general inventive concept and methods of accomplishing the same may be understood more readily by reference to the following detailed description of exemplary embodiments and the accompanying drawings. The present general inventive concept may, however, be embodied in many different forms and should not be construed as being limited to the exemplary embodiments set forth herein. In the drawings, the thickness of layers and regions are exaggerated for clarity and like reference numerals refer to like elements throughout.

It will be understood that when an element or layer is referred to as being "on," or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

Exemplary embodiments described herein will be described while referring to plan views and/or cross-sectional views of ideal schematic views of the invention. Accordingly, the exemplary views may be modified depending on manufacturing technologies and/or tolerances. Therefore, the exemplary embodiments of the general inventive concept are not limited to those illustrated in the figures, but include modifications in configuration due to variations in manufacturing processes. Therefore, regions illustrated in the figures having schematic properties and shapes of regions are not limit to those illustrated herein.

Hereinafter, the exemplary embodiments of the present general inventive concept are described in detail by referring to the attached drawings.

Referring to FIGS. 1 through 8, a fabricating method of a semiconductor device according to an exemplary embodiment of the present general inventive concept is described. FIGS. 1 through 8 are sectional views sequentially illustrating a fabricating method of a semiconductor device according to an exemplary embodiment of the present general inventive concept.

Referring to FIG. 1, multiple dielectric layers 20 and multiple conductive layers 30 are alternately stacked to form a stack structure on a substrate 10.

The substrate 10 may be composed of a transparent glass material including $SiO_2$ as major component; however, it is not limited thereto and the substrate 10 may be composed of a transparent plastic material. The plastic material may be at least one dielectric organic material selected from the following: polyallylate, polyethersulphone, polyphenylenesulfide, polyimide, polyethylene terephthalate, polyetherimide, cellulose triacetate, polyethylenenaphthalate, cellulose acetate propionate, polyacrylate, and polycarbonate, or combination thereof. The dielectric organic material is not limited to the exemplary list provided above.

The dielectric layer 20 may be formed as multiple layers, and FIG. 1 illustrates an example where a first dielectric layer 21, a second dielectric layer 22, and a third dielectric layer 23 are formed alternately with the conductive layers 30. However, it is not limited thereto, and more than 3 dielectric layers can be stacked. The first dielectric layer 21, the second dielectric layer 22, and the third dielectric layer 23 may be formed of either the same material or different materials, and each layer may be formed with the same or different thicknesses. The dielectric layer 20 may be an inorganic layer or an organic layer. The inorganic layer, for example, may be formed with at least one selected from the following: $SiO_2$, $SiN_x$, SiON, $Al_2O_3$, $TiO_2$, $Ta_2O_5$, $HfO_2$, $ZrO_2$, BST, and PZT. Also, the organic layer, for example, may be formed with at least one selected from the following: general commercial polymers (PMMA, PS), polymer derivatives including phenol group, acrylic polymers, imide polymers, aryl ether polymers, amide polymers, fluorinated polymer, p-xylene polymer, polyvinyl alcohol or a blend thereof. Also, the dielectric layer 20 may be formed as a mixed stack structure having an inorganic layer and an organic layer. The dielectric layer 20 may be stacked on the substrate 10 or the conductive layer 30 by using various methods, including, for example, chemical vapor deposition.

The conductive layer 30 may be formed with at least one conductive material selected from the following: Ti, Ta, Cr, Al, aluminum series metal including Al and aluminum alloy, silver series metal including Ag and silver alloy, copper series metal including Cu and copper alloy, molybdenum series metal including Mo and molybdenum alloy, tungsten (W), and polysilicon doped with impurities. The conductive layer 30 may be deposited, for example, by sputtering. In FIG. 1, although it is illustrated that the three-layered conductive layer 30 including a first conductive layer 31, a second conductive layer 32, and a third conductive layer 33 is formed alternately with the dielectric layer 20, it is not limited thereto and a conductive layer with more than three-layers can be stacked. The first conductive layer 31, the second conductive layer 32, and the third conductive layer 33 may be formed of either the same material or different materials, and each layer may be formed with the same or different thicknesses.

In the case when the dielectric layer 20 and the conductive layer 30 are stacked alternately, n (n is an integer) conductive layers may be stacked and n layers or n+1 layers of the dielectric layer 20 may be stacked alternately with the n layers of the conductive layer 30.

Figure 2:
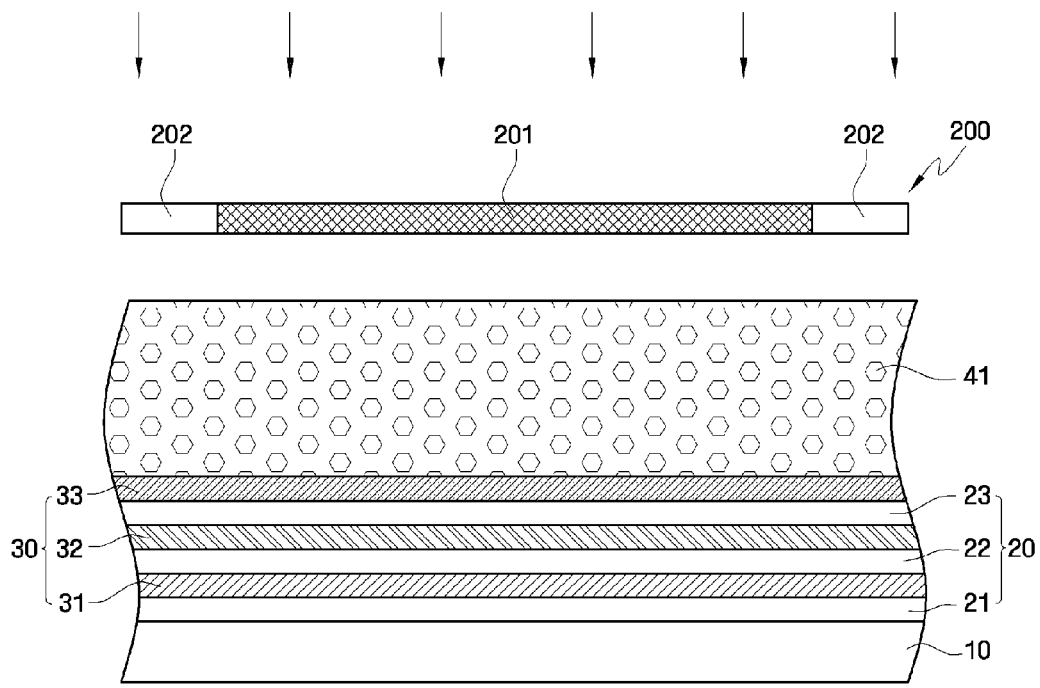
Figure 3:
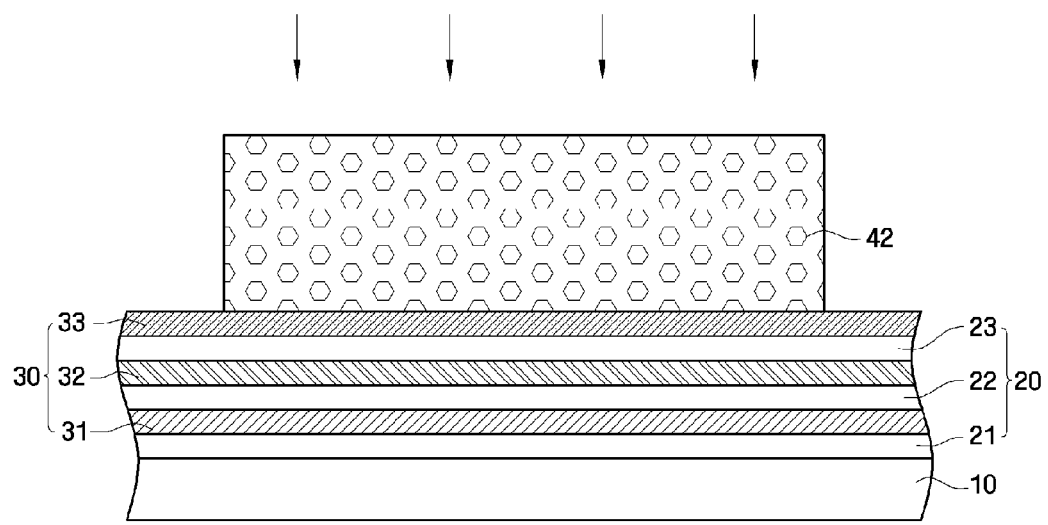

Referring to FIGS. 2 and 3, a first photoresist pattern 42 is formed on the stacked structure.

Referring to FIG. 2, on an upper surface of the stacked structure (i.e., on the dielectric layer 20 or the conductive layer 30 placed on top of the stacked structure), for example, on the third conductive layer 33, a photoresist 41 is deposited by using chemical vapor deposition, and a photo mask 200 is placed on the photoresist 41. To aid understanding, FIG. 2 illustrates that the photoresist 41 is a positive photoresist. However, it is not limited thereto and a negative photoresist may be used. The photomask 200 includes a light blocking section 201 and a light penetration section 202. The light blocking section 201 blocks light entering the photomask and the light penetration section 202 allows light to penetrate the photomask. The photomask 200 is placed such that the light blocking section 201 can correspond to a certain area on the substrate 10, for example, the area where the semiconductor device is formed. Next, after irradiating light on the photoresist 41 through the photomask 200, the photoresist 41 is developed. Referring to FIG. 3, the photoresist region corresponding to the light penetration section 202 is removed, and the remaining photoresist region corresponding to the light blocking section 201 becomes the first photoresist pattern 42.

Figure 4:
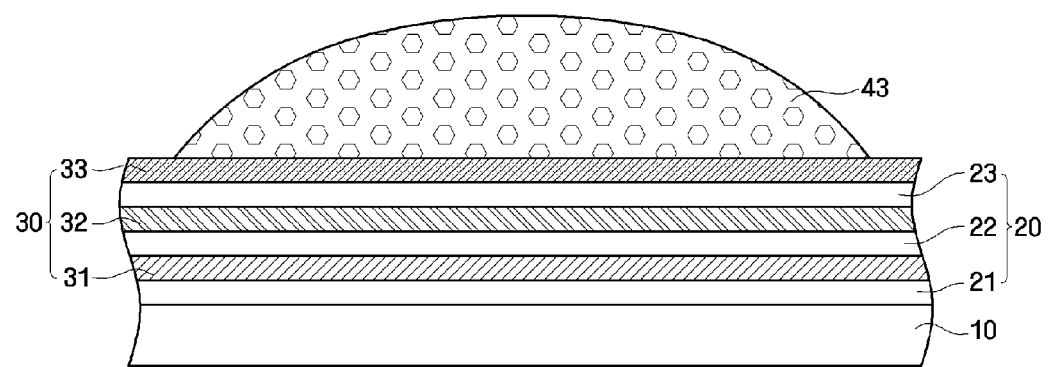

Referring to FIG. 4, the first photoresist pattern 42 subjected to a reflow process to form a second photoresist pattern 43. The first photoresist pattern 42 can be reflowed by performing, for example, a heat treatment at a temperature between about 100° C. and about 200° C. for 1 to 10 minutes, and the conditions can change depending on the type of the photoresist. When the reflow is performed with the above condition, the second photoresist pattern 42 suitable for a following etch process can be formed. After heat treatment, the ability of the first photoresist pattern 42 to flow is increased and the first photoresist pattern 42 is reflowed to expand on the third conductive layer 33. As a result, the dome-type second photoresist pattern 43 has a convex center and is symmetric with respect to the center of the stacked structure. Further, the second photoresist pattern 43 is sloped downward as the second photoresist pattern 43 extends towards the end part of the second photoresist pattern 43. The second photoresist pattern 43 has a shape having a larger size than the first photoresist pattern 42 due to the expansion of the photoresist pattern 43 and the thickness is reduced as the photoresist pattern 43 extends toward the edge of the stacked structure. In this operation, the center thickness may be similar to, or thicker than, the stacked structure including the dielectric layer 20 and the conductive layer 30 formed under the second photoresist pattern. When the center thickness of the second photoresist pattern 43 is formed similar to, or thicker than, the stacked structure formed under the second photoresist pattern, the center of the dielectric layer 20 and the conductive layer 30 can be protected from etching in the subsequent etch process.

Figure 5:
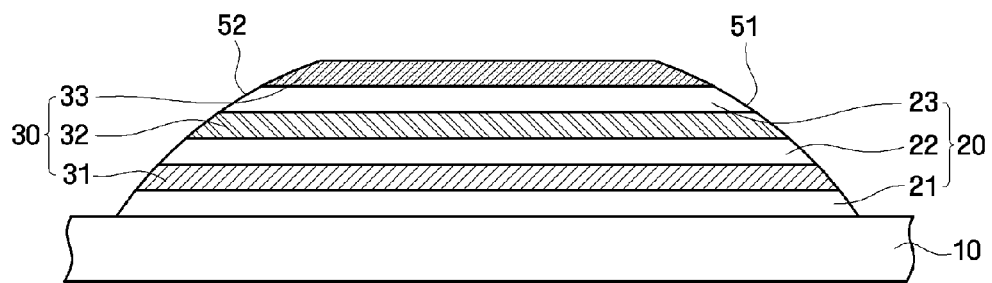

Referring to FIG. 5, by performing a first etching on the dielectric layer 20 and the conductive layer 30 of the stack structure, the dielectric layer 20 and the conductive layer 30 are formed so as to have a slope profile similar to a slope profile of the second photoresist pattern 43.

The first etching may be performed by dry etching or wet etching. For the wet etching, an etchant such as phosphoric acid, nitric acid, acetic acid, or fluoric acid can be used. For dry etching, for example, a mixed gas including $Cl_2$, $BCl_3$, chlorine gas with argon (Ar) gas, or etch gas including BOE (buffered oxide etchant) or $H_2O$:HF can be used.

The first etching may be performed using non-selective etching having no etch selectivity of the dielectric layer 20 to the conductive layer 30. By using the non-selective etching, etching is performed along the second photoresist pattern 43, thereby resulting in a slope pattern that is similar to or identical to the profile of the second photoresist pattern 43 being formed. The slope pattern can be a dome-type pattern including slope sections 51 and 52 where the thickness of the stacked structure is reduced toward the edge of the stacked structure.

Figure 6:
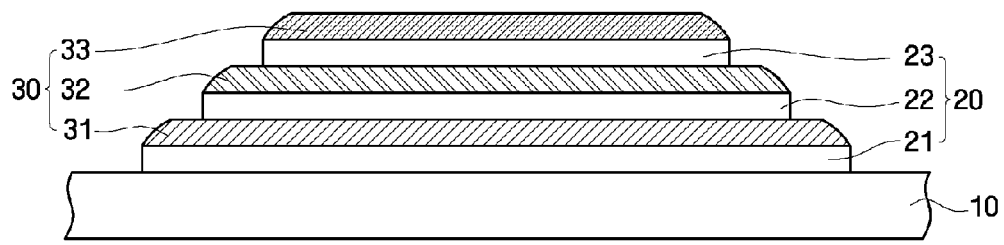

Referring to FIG. 6, by performing a second etching on the stack structure including the side slope profile, a step-type profile is formed on the end part of the stack structure.

The second etching can be performed consecutively after the first etching, and it can be performed using dry etching or wet etching. For the second etching, a wet etchant or gas etchant having an etch selectivity of the dielectric layer 20 to the conductive layer 30 can be used. The etch selectivity can be between 1:10 and 1:100; however, it is not limited thereto and a ratio that etches the dielectric layer 20 while not etching the conductive layer 30 is sufficient. By using such selective etching, the conductive layer 30 is not etched and only the dielectric layer 20 is etched during the second etching. More specifically, the first conductive layer 31, the second conductive layer 32, and the third conductive layer 33 are not etched, and the first dielectric layer 21, the second dielectric layer 22, and the third dielectric layer 23 are etched respectively by using the first conductive layer 31, the second conductive layer 32, and the third conductive layer 33 as etch masks. Further, the second dielectric layer 22 is etched using the second conductive layer 32 as an etch mask and the end sides of the first conductive layer 31 are exposed. Also, the third dielectric layer 23 is etched using the third conductive layer 33 as an etch mask and the end sides of the second conductive layer 32 are exposed. As a result, the step-type profile is formed.

Figure 7:
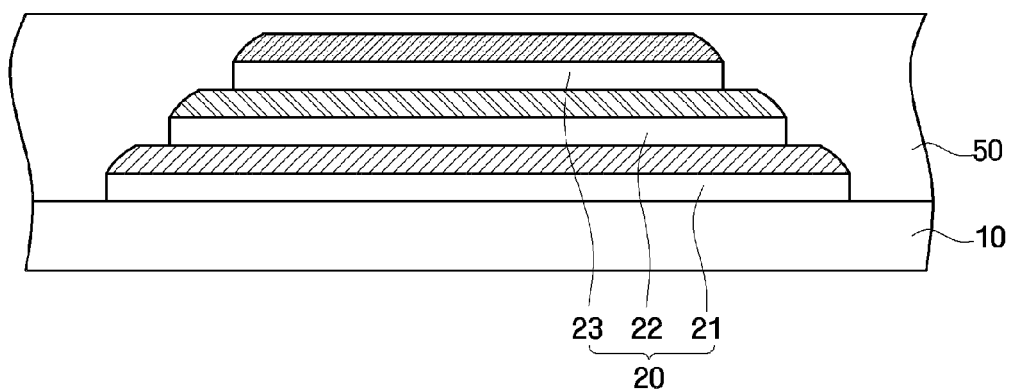

Referring FIG. 7, a passivation layer 50 is formed on the resulting stacked structure as illustrated in FIG. 6.

The passivation layer 50 may be formed on an entire surface of the substrate 10, and on the stacked structure so as to cover the third conductive layer 33. Also, the passivation layer 50 can be formed to have a height measured from the substrate 10 that is the same as that of the third conductive layer 33. FIG. 7 illustrates a case where the passivation layer 50 is formed on the third conductive layer 33 (i.e., the passivation layer 50 covers the third conductive layer 33). The passivation layer 50 can be formed with inorganic or organic materials, and for example, can be formed with silicon nitride, silicon oxide, or combination thereof. The passivation layer 50 can be formed using various methods including, for example, a chemical vapor deposition.

Figure 8:
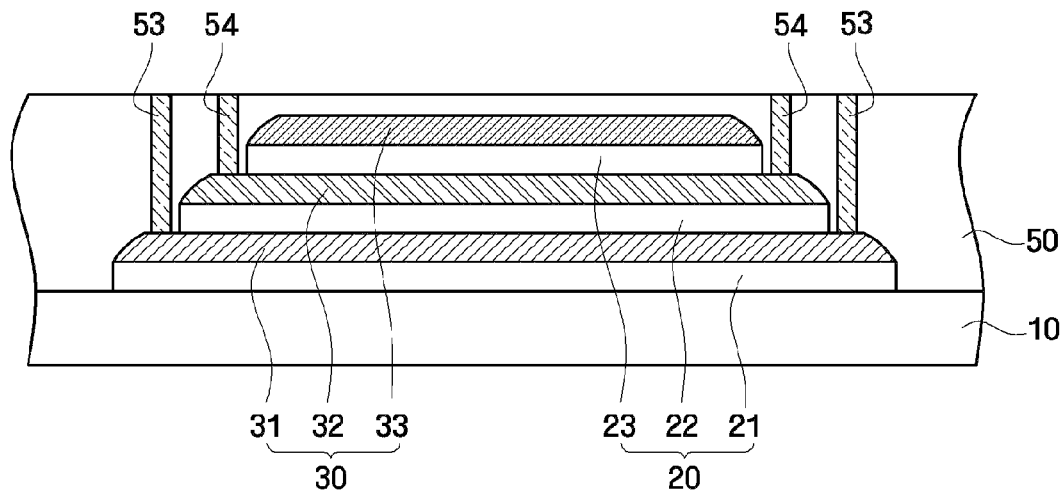

Referring to FIG. 8, contact holes 53 and 54 that expose an end part of each layer of the conductive layer 30 are formed inside the passivation layer 50. For exemplary purposes, FIG. 8 illustrates contact holes being formed so as to expose the first and second layers 31 and 32 of the conductive layer 30. Further, each of the contact holes 53 and 54 are filled with conductive materials.

By etching the passivation layer 50, the contact holes 53 and 54 that expose both ends of the conductive layers except the top conductive layer (i.e., the first conductive layer 31 and the second conductive layer 32), can be formed respectively. Next, the contact holes 53 and 54 are filled with conductive materials using various methods including, for example, chemical vapor deposition. Although not shown in the drawings, when forming a metal interconnection connected to the contact holes 53 and 54, the metal interconnection is electrically connected to the first conductive layer 31 and the second conductive layer 32. As described above, in case of a semiconductive device having end parts with a step style profile, end parts of conductive layers formed in a lower region are exposed and a contact part can be formed on the exposed end parts. As a result, metal interconnections can be formed effectively.

Based on the fabrication method of a semiconductor device according to an exemplary embodiment of the present general inventive concept described above, a semiconductor device including end parts with a step style profile can be fabricated using a simple process. In the conventional methods to form a step profile on the end part of a semiconductor device having multiple layers, a photoresist pattern is formed for each layer and a photo etch process is performed followed by a photoresist trimming process and another photo etch process. Such methods increase product costs since the number of processes increases as the number of layers is increased. However, according to the method based on this exemplary embodiment, the semiconductor device having a step profile end part can be formed by performing one photo and etch process regardless of the layers stacked in the semiconductor device.

Hereinafter, by referring to FIGS. 9 through 24 a fabrication method of a semiconductor device according to another exemplary embodiment of the present general inventive concept is described. FIGS. 9 through 24 are sectional views sequentially illustrating a fabricating method of a semiconductor device according to another exemplary embodiment of the present general inventive concept. The semiconductor device fabricated according to this exemplary embodiment can be a non-volatile memory device such as a Vertical NAND flash memory device. The Vertical NAND flash memory device can include multiple semiconductor patterns extended vertically from the substrate, multiple cell transistors using the semiconductor patterns as channel, and bit lines electrically connected to the semiconductor patterns. The following describes various fabrication methods in detail.

Figure 9:
FIGS. 9 through 24 are sectional views sequentially illustrating a fabricating method of a semiconductor device according to another exemplary embodiment of the present general inventive concept.

Referring to FIG. 9, a mold structure is formed that includes multiple dielectric layers 101 and multiple sacrificial layers 102 that are alternately stacked on a semiconductor substrate 100.

The semiconductor substrate 100 may be composed of a single crystal semiconductor material, for example, single crystal silicon. By doping N-type impurities into the semiconductor substrate 100, an impurity region (not shown) used as a source of a NAND flash semiconductor device can be formed. The semiconductor substrate 100 and the source can be doped with different conductive types. For example, the semiconductor substrate 100 can be a P-type material doped with a 3B group element, such as boron (B), in a single crystal silicon and the source can be an N-type material doped with a 5B group element, such as phosphorous (P), in a single crystal silicon.

On the semiconductor substrate 100, a common source line (not shown) can be formed. The common source line, for example, can be formed with silicide including cobalt (Co) or nickel (Ni). The common source line is electrically connected to the source formed on the semiconductor substrate 100.

The dielectric layer 101 and the sacrificial layer 102 can be alternately stacked on the semiconductor substrate 100 in a vertical direction. The sacrificial layer 102 is removed in the subsequent process to define a region where a gate electrode is formed. In FIG. 9, it is illustrated that 6 layers of a dielectric layer 101a-101f and 5 layers of a sacrificial layer 102a-102e are stacked on the semiconductor substrate 100 alternately in the vertical direction; however, the present inventive concept is not limited thereto, and more layers can be stacked. In the case of a vertical memory device, multiple cell transistors stacked in the vertical direction can be included. Here, a number of layers of the dielectric layer 101 and the sacrificial layer 102 stacked are equal to or more than a number of the cell transistors. Thus, in the case where n cell transistors are connected in series, it is recommended to have 1 to n+1 dielectric layers 101 and 1 to n+1 sacrificial layer 102 stacked alternately. Also, in the drawings, it is illustrated that each sacrificial layer 102 has an identical thickness; however, the thickness of each of the sacrificial layers 102 can be different. By adjusting the thickness of the sacrificial layers 101a-101f, the thickness of a region where the sacrificial layers 101a-101f are removed can be adjusted, thereby adjusting the thickness of the gate electrode formed in the removed region. As a result, a channel length of each transistor of the cell transistor can be formed differently.

The dielectric layer 101 and the sacrificial layer 102 can be formed with materials having different etch selectivity. The etch selectivity of the dielectric layer 101 and the sacrificial layer 102 can be, for example, between 1:10 and 1:100. However, the selectivity is not limited thereto and an etch selectivity that allows the dielectric layer 121 to remain during the removal of the sacrificial layer 102 in the subsequent process is sufficient. The sacrificial layer 102, for example, can be formed with silicon nitride ($SiN_x$) and the dielectric layer 101 can be formed with silicon oxide ($SiO_x$), or vice versa. Hereinafter, for exemplary purposes, it is illustrated to have the dielectric layer 101 formed with silicon oxide ($SiO_x$) and the sacrificial layer 102 formed with silicon nitride ($SiN_x$).

Figure 10:
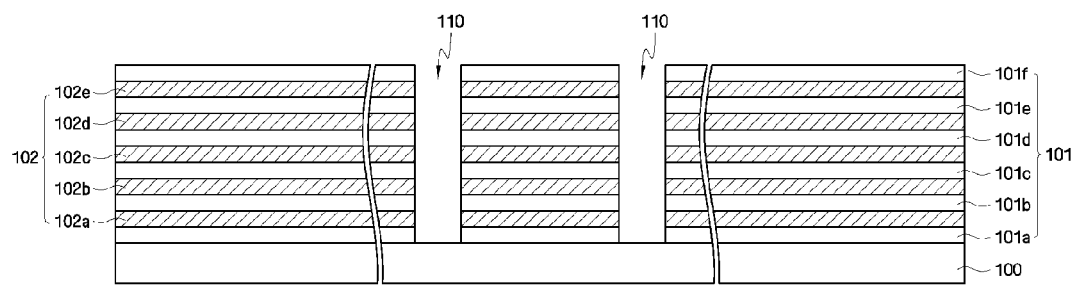

Referring to FIG. 10, a first open area 110 that penetrates the dielectric layer 101 and the sacrificial layer 102 is formed.

A photoresist is placed on a dielectric layer 101f and a first photoresist pattern (not shown) is formed by a photolithography. Then, by etching the dielectric layer 101 and the sacrificial layer 102 sequentially using the first photoresist pattern as etch mask, the first open area 110 for semiconductor pattern formation is formed. The first open area 110 exposes certain regions of the semiconductor substrate 100.

Figure 11:
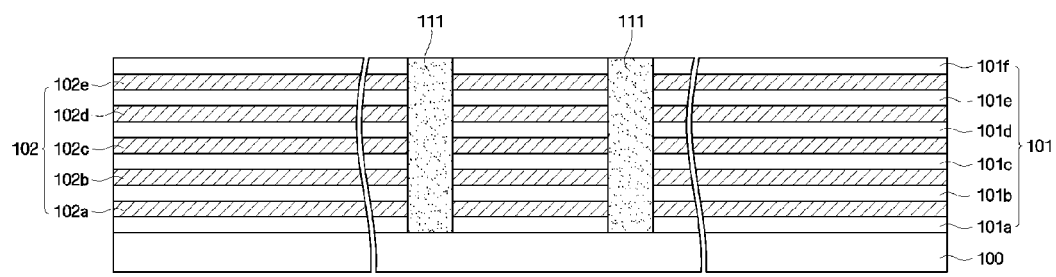

Referring to FIG. 11, by filling the first open area 110 with semiconductor material, a semiconductor pattern 111, which extends in a second direction (for example, Y direction), is formed.

The semiconductor pattern 111 can be formed as a pillar (cylindrical) shape that extends in the vertical direction with respect to the semiconductor substrate 100. The semiconductor pattern 111 may be formed by using chemical vapor deposition, and for example, the semiconductor pattern 111 can be formed as amorphous silicon or single crystal silicon. When the semiconductor pattern 111 is formed with single crystal silicon, it can be formed by forming amorphous silicon that is then subjected to a heat treatment to transform amorphous silicon into single crystal silicon with a phase change. Alternatively, the semiconductor pattern 111 can be formed by performing an epitaxial growth process using the semiconductor substrate 100 as a seed. Also, the semiconductor pattern 111 can be formed as an N-type impurities doped single crystal silicon by performing in-situ doping during chemical vapor deposition. Then, depending on the demand to expose the top of the dielectric layer 101 or the sacrificial layer 102, chemical mechanical polishing (CMP) process can be additionally performed.

The semiconductor pattern 111 can be formed so as to have a regular arrangement on the semiconductor substrate 100 and multiple patterns can be formed. Specifically, the patterns can be formed to have constant intervals in a first direction (for example, X direction) and a third direction (for example, Z direction) which is vertical with respect to the first direction.

Figure 12:
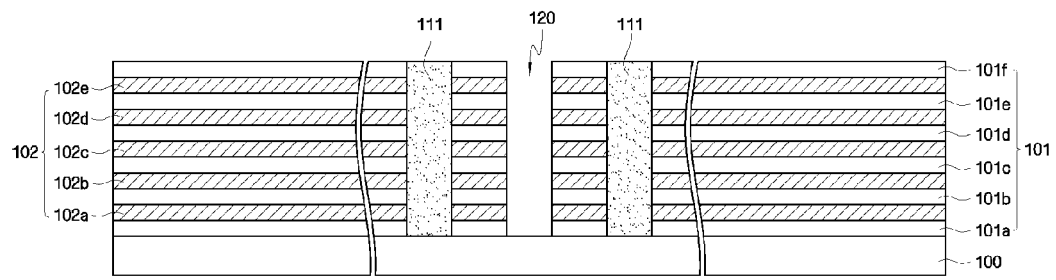

Referring to FIG. 12, a second open area 120 that exposes part of the mold structure can be formed. In the subsequent process the second open area 120 can be used as a path that allows wet etchant to penetrate the sacrificial layers 102a-102e to remove the sacrificial layers 102a-102e.

A photoresist pattern that exposes a predetermined area between the semiconductor patterns 111 is formed by using the photoresist pattern as an etch mask, thereby the dielectric layer 101 and the sacrificial layer 102 are etched. As a result, the second open area 120 that penetrates the dielectric layer 101 and the sacrificial layer 102 is formed. In FIG. 12 only one second open area 120 is illustrated; however, multiple second open areas 120 can be formed between the semiconductor patterns 111.

Figure 13:
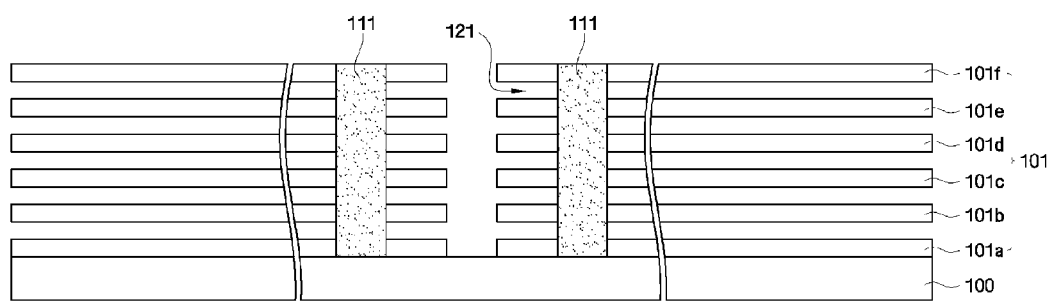

Referring to FIG. 13, the sacrificial layers 102a-102e exposed by the second open area 120 are selectively removed.

To selectively remove the sacrificial layers 102a-102e exposed by the sides of the second open area 120, wet etchant is provided in the second open area 120. The etching can be performed by using a wet etching process that includes, for example, a phosphoric acid or fluoric acid solution. By using such etching process, only the sacrificial layers 102a-102e are removed and the dielectric layers 101a-101f remain. In the region where the sacrificial layers 102a-102e on the sides of the second open area 120 are removed, hollow portions 121 are formed. The hollow portions 121 of each layer are connected to each other and a predetermined side area of the semiconductor pattern 111 is exposed by the hollow portions 121.

Figure 14:
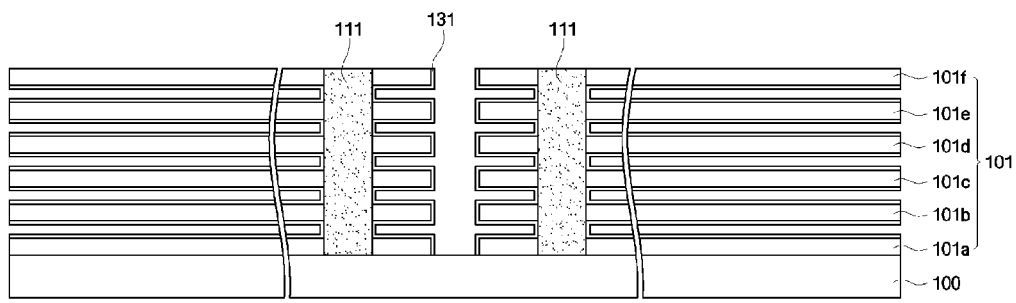

Referring to FIG. 14, on the side of the semiconductor pattern 111 exposed by the hollow portions 121, and on the entire surface of the dielectric layers 101a-101f, a charge storage layer 131 is formed. The charge storage layer 131 stores information by trapping charges.

The charge storage layer 131 can be formed so as to conform to the sides of the semiconductor pattern 111 exposed by the hollow portions 121 and on the entire surface of the dielectric layers 101a-101f. The charge storage layer 131 can be formed as a nitride layer or a high-k layer. The nitride layer, for example, can include at least one selected from the following: silicon nitride, silicon oxynitride, hafnium silicon oxynitride, hafnium oxynitride, zirconium oxynitride, and hafnium aluminum oxynitride, or combination thereof. The high-k layer, for example, can include at least one selected from the following: hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The charge storage layer 131 can be formed by using, for example, chemical vapor deposition or atomic layer deposition. More specifically, the charge storage layer 131 can be formed with an ONO layer, ONA layer, or ONOA layer. When the charge storage layer 131, for example, is formed with an ONO layer, the silicon nitride layer stores information by trapping charges, and one of the silicon oxide layer and aluminum oxide layer can be used as a tunnel dielectric layer and the other can be used as a blocking dielectric layer.

Figure 15:
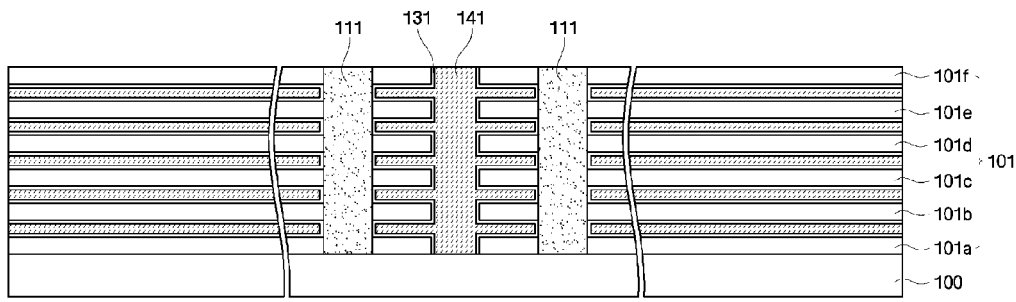

Referring to FIG. 15, a conductive layer 141 is deposited to completely fill the second open area 120 and the hollow portions 121. The conductive layer 141 is provided as a gate electrode through the subsequent processes.

The conductive layer 141 can be deposited by using chemical vapor deposition or atomic layer deposition, so as to completely fill the second open area 120 and the hollow portions 121 without voids. The conductive layer 141 may be formed with, for example, polysilicon doped with impurities or tungsten. After depositing the conductive layer 141, depending on the demand, chemical mechanical polishing process can be performed to expose the semiconductor pattern 111 and the dielectric layer 101f.

Figure 16:
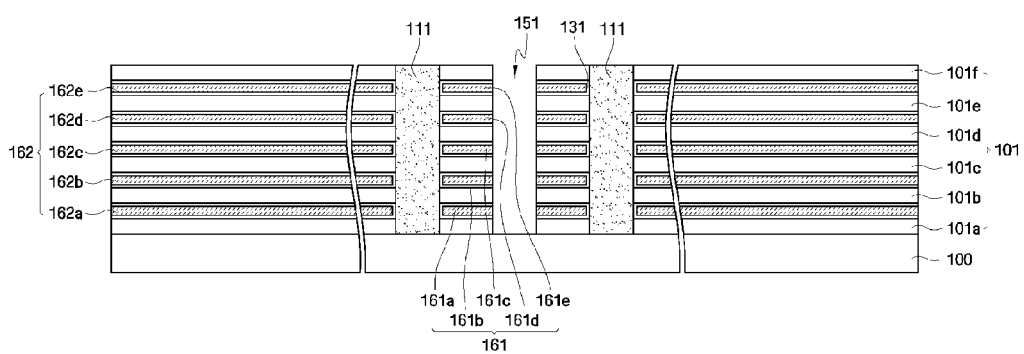

Referring to FIG. 16, multiple gate electrodes 161a-161e are formed by removing the conductive layer 141 formed within the second open area 120. That is, the conductive layer 141 is removed from the second open area 120 while the portions formed in the hollow portions 121 remain.

By removing the conductive layer 141 formed within the second open area 120, a third open area 151 that penetrates the conductive layer 141 is formed. To form the third open area 151, a second photoresist pattern (not shown) is provided that selectively exposes the top of the conductive layer 141 through the performance of anisotropic etching of the conductive layer 141 exposed by the second photoresist pattern as etch mask. The third open area 151 exposes the same area or area larger than that exposed by the second open area 120. The third open area 151 divides the conductive layer 141 vertically and a certain area of the substrate 100 is exposed. Also, by performing the process above, the multiple gate electrodes 161a-161e are formed such that the gate electrodes 161a-161e formed in the different layers are isolated. FIG. 15 illustrates a case where the first gate electrode 161a through the fifth gate electrode 161e are formed sequentially. Also, when forming the third open area, part of the charge storage layer 131 is removed and the charge storage layers 131 of in each layer are disconnected from each other. In a semiconductor device according to this exemplary embodiment, the multiple gate electrodes 161a-161e extended in the first direction, for example, can be used as the multiple word lines 162a-162e.

Figure 17:
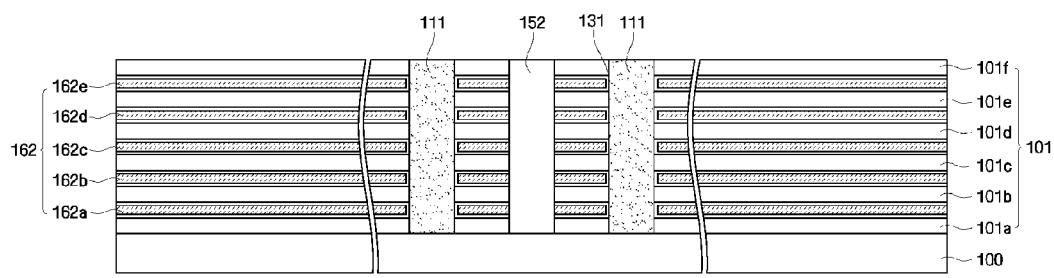

Referring to FIG. 17, an isolation dielectric layer 152 can be formed by filling the third open area 151 with dielectric layer.

The isolation dielectric layer 152 can be formed with an organic dielectric layer or an inorganic dielectric layer, and specifically can be formed with a silicon oxide layer or silicon nitride layer by using various methods, including, for example, chemical vapor deposition.

Figure 18:
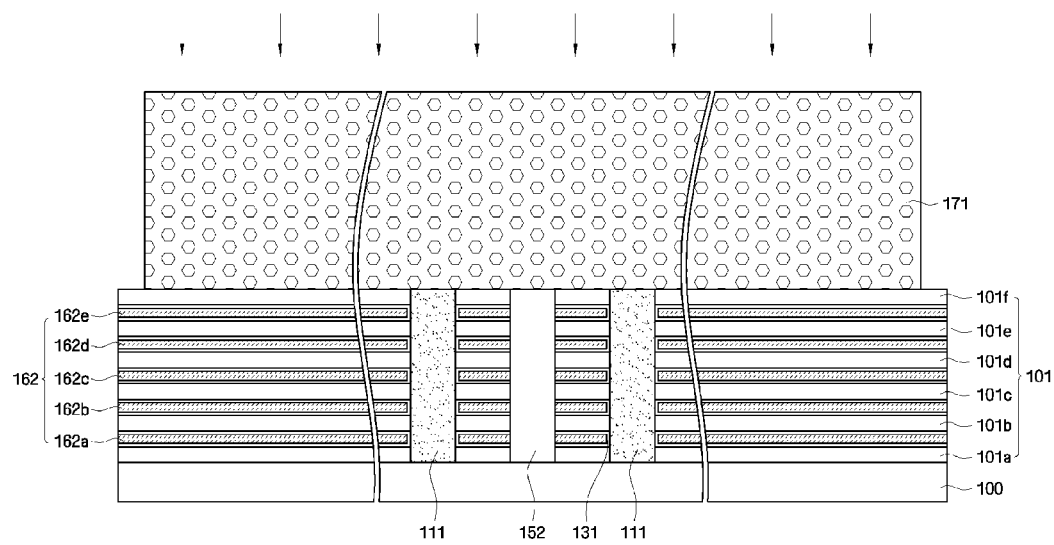

Referring to FIG. 18, following the formation of the isolation dielectric layer 152, a third photoresist pattern 171 is formed on the mold structure (i.e. on the top surface of the upper dielectric layer 101f).

On the mold structure (on top of the dielectric layer 101f, the semiconductor pattern 111, and the isolation dielectric layer 152), a photoresist is formed and developed by radiating light by using a photo mask. As a result, the third photoresist pattern 171 is formed such that the third photoresist pattern exposes only certain areas of end parts of the mold structure.

Figure 19:
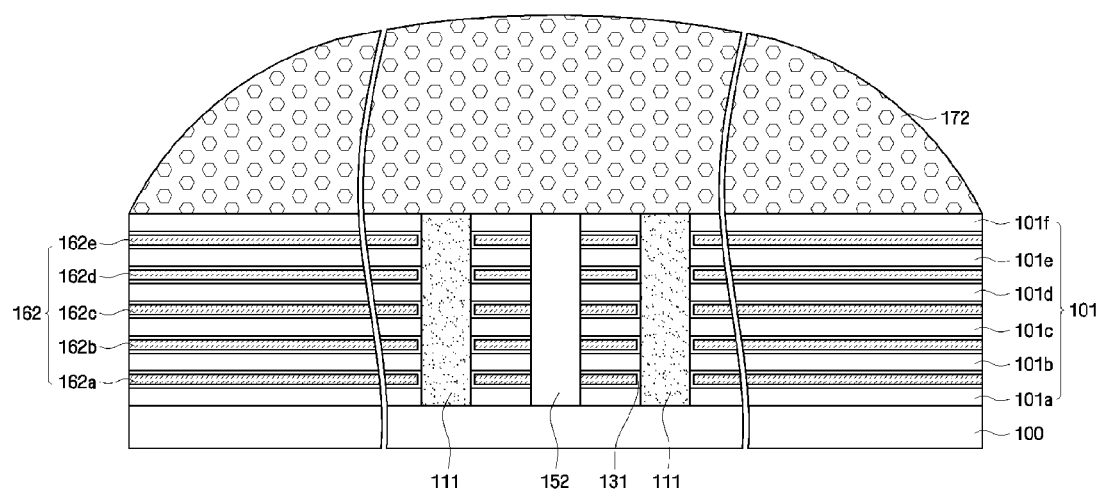

Referring to FIG. 19, a fourth photoresist pattern 172 whose thickness is reduced as the fourth photoresist pattern 172 extends away from the center of the mold structure by subjecting the third photoresist pattern 171 to a reflow process.

The reflow process can be done by subjecting the third photoresist pattern 171 to a heat treatment at a temperature between about 100° C. and 200° C. for about 1 to about 10 min. Due to the reflow process, the ability of the third photoresist pattern 171 to flow is increased and the third photoresist pattern 171 is extended outwardly (from the center) on the dielectric layer 101f. As a result, the thickness of the fourth photoresist 172 is reduced as the fourth photoresist 172 extends toward the end parts of the mold structure. Thus, the third photoresist pattern 171 becomes the fourth photoresist pattern 172 with a symmetric dome shape that is sloped downward as the fourth photoresist 172 extends toward the end parts of the mold structure.

Figure 20:
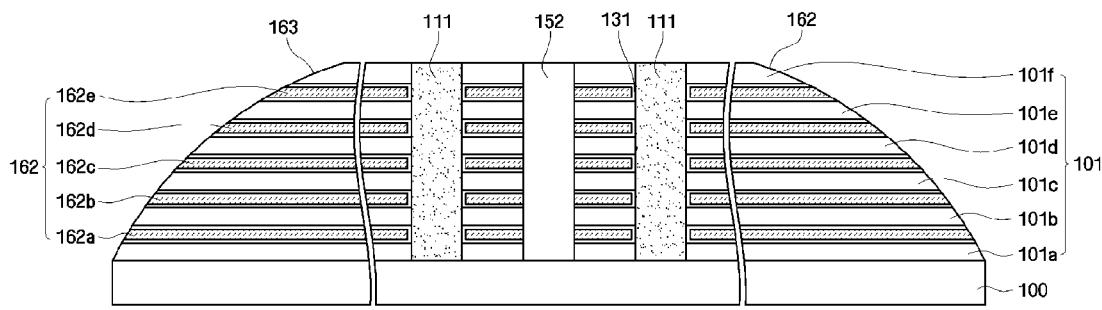

Referring to FIG. 20, by performing a first etching using the fourth photoresist pattern 172 as a photomask, a profile having the thickness that is reduced toward the end parts is formed on the mold structure.

The first etching can be performed using dry etching or wet etching, and it can be a non-selective etching that uses the fourth photoresist pattern as a photo mask. The first etching etches the fourth photoresist pattern 172, the dielectric layer 101, and a word line 162. As a result, a slope profile similar to the slope profile of the fourth photoresist pattern 172 is formed on the mold structure. Thus, on the semiconductor substrate 100, the mold structure including a dome-type profile is formed.

Figure 21:
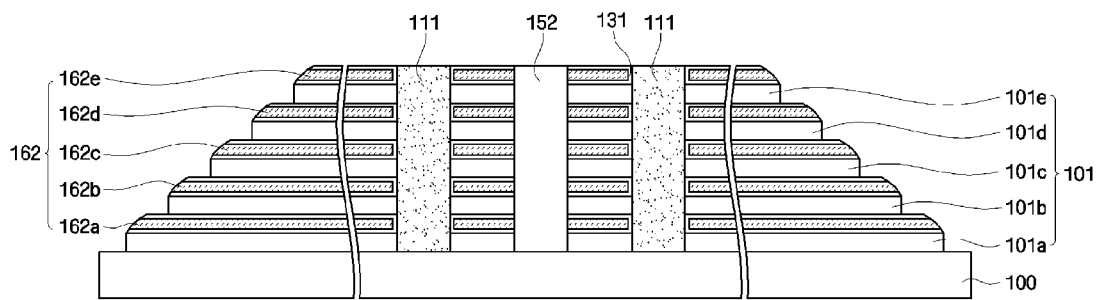

Referring to FIG. 21, a step profile can be formed on end parts of the mold structure by performing selective etching which only etches the dielectric layer 101.

After the first etching, a second etching may be performed continuously. The second etching is a selective etching which only etches the dielectric layer 101. The second etching can be performed using dry etching or wet etching, and a gas etchant or wet etchant having a large etch selectivity of the dielectric layer 101 to the word line 162. Since the word line 162 is not etched during the second etching, the first dielectric layer 101a is etched by using the first word line 162a as an etch mask and the second dielectric layer 101b is etched by using the second word line 162b as an etch mask. As a result, both ends of the first word line 162a are exposed. Similarly, the third dielectric layer 101c is etched by using the third word line 162c as an etch mask to expose both ends of the second word line 162b, and the fourth dielectric layer 101d is etched by using the fourth word line 162d as an etch mask to expose both ends of the third word line 162c. By performing the steps above, a step profile that exposes ends of the word line 162a-162e of each layer is formed. Here, the top dielectric layer 101f may also be etched to expose the fifth word line 162e.

As described above, according to the fabricating method of a semiconductor device based on this exemplary embodiment, a step profile having exposed ends of each layer of the device can be formed by performing a single photolithography process.

Figure 22:
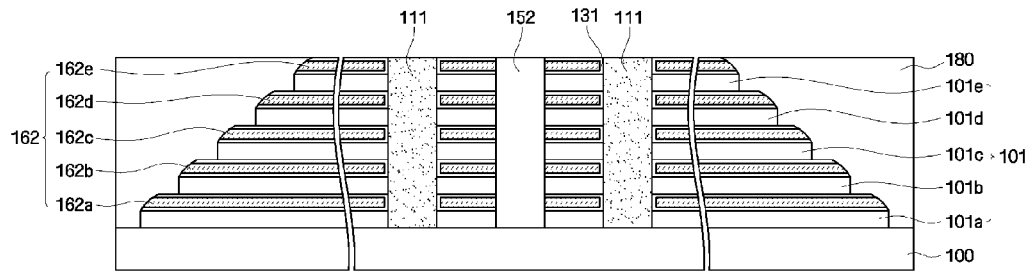

Referring to FIG. 22, a passivation layer 180 can be formed to cover the entire surface of the mold structure that has been subjected to the second etching.

The passivation layer 180 can be formed to cover the step profile on the entire semiconductor substrate 100. For example, the passivation layer 180 can be formed to have the same height as the gate electrode 161e. The passivation layer 180 can be formed with an inorganic dielectric layer or an organic dielectric layer by using various methods, including, for example, a chemical vapor deposition.

Figure 23:
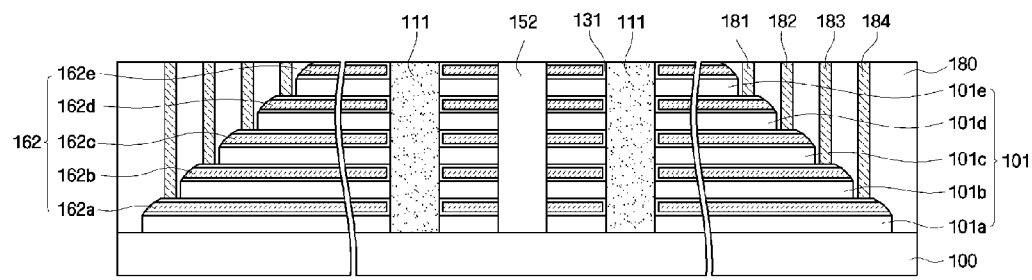

Referring to FIG. 23, contact holes 181, 182, 183, and 184 that expose the end parts of word lines may be formed on the passivation layer 180.

The contact holes 181, 182, 183, and 184 are formed by performing etching by using the fifth photoresist pattern as an etch mask disposed on the passivation layer 180. In this case, the fifth photoresist pattern (not shown) is formed on the passivation layer 180 that exposes the area corresponding to the end part of the word lines 162a-162e. Next, the contact holes 181, 182, 183, and 184 are filled with a conductive material. In a semiconductor device according to this exemplary embodiment, since the end parts are formed in a step shape, the contact holes 181, 182, 183, and 184 that expose the end part of the word lines 162a-162d of each layer can be formed.

Figure 24:
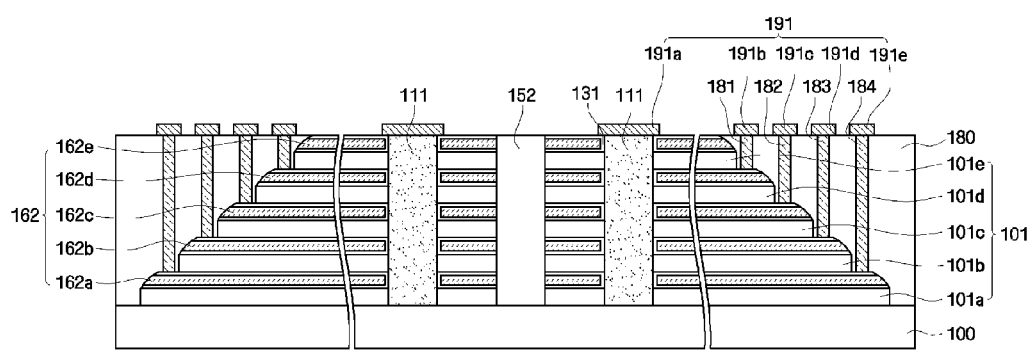

Referring to FIG. 24, a bit line 191 extended in the third direction can be formed on the semiconductor pattern 111 and the contact holes 181, 182, 183, and 184. The bit line 191, for example, connects the semiconductor pattern 111 placed in the third direction. Also, the bit line 191 is connected to the word lines 162a-162e through the contact hole 181, 182, 183, 184. The bit line 191 electrically connects the word lines 162a-162e placed in the third direction. Here, the bit line 191 is formed to directly connect to the semiconductor pattern 111 and connect to the word lines 162a-162e through the contact holes 181, 182, 183, and 184.

By performing the above processes, cell transistors connected in series in the vertical direction may be completed. Here, the transistors placed in the top and bottom part of the semiconductor pattern 111 are not used as a cell transistor, and can be used as a select transistor. Thus, the top and bottom transistors can be used as a string select transistor or a ground select transistor.

As described above, according to the fabricating method based on this exemplary embodiment, a semiconductor device including the end parts with a multi-step profile may be formed by performing a single photolithography process and a single etch process. When the end parts have a step profile, wire interconnection can be easily achieved.

A non-volatile memory device fabricated according to the exemplary embodiments of the present general inventive concept can be mounted as various types of packages. For example, the non-volatile memory device fabricated according to the exemplary embodiments of the present general inventive concept can be packaged by using methods including at least one selected from the following: Package on Packages, Ball Grid Arrays, Chip scale packages, Plastic Leaded Chip Carriers, Plastic Dual In-Line Packages, Multi Chip Packages, Wafer Level Packages, Wafer Level Fabricated Packages, Wafer Level Processed Stack Packages, Die On Waffle Packages, Die in Wafer Forms, Chip On Boards, Ceramic Dual In-Line Packages, Plastic Metric Quad Flat Packs, Thin Quad Flat Packs, Small Outline Packages, Shrink Small Outline Packages, Thin Small Outline Packages, Thin Quad Flat Packages, and System In Packages.

While the present general inventive concept has been particularly shown and described with reference to exemplary embodiments thereof, it will be understood by those of ordinary skill in the art that various changes in form and details may be made therein without departing from the spirit and scope of the present general inventive concept as defined by the following claims and their equivalents.

What is claimed is:

1. A method of fabricating a semiconductor device, the method comprising:
    alternately stacking a plurality of dielectric layers and a plurality of conductive layers on a substrate to form a stack structure;
    forming a first photoresist pattern on the stack structure;
    forming a second photoresist pattern whose thickness is reduced as the second photoresist pattern extends from the center of the stack structure towards a periphery of the stacked structure by performing a heat treatment on the first photoresist pattern;
    etching the stack structure through the second photoresist pattern to form a slope profile on the stack structure whose thickness is reduced as the slope profile extends from the center of the stack structure towards the periphery of the stacked structure; and
    forming a step-type profile along the periphery of the stack structure by selectively etching the dielectric layer.

2. The method of claim 1, wherein an end part of each of the plurality of conductive layers is exposed by the step type profile.

3. The method of claim 1, further comprising:
    forming a passivation layer on the stack structure; and
    forming a plurality of contact holes in the passivation layer to expose end parts of the plurality of conductive layers.

4. The method of claim 3, forming metal interconnections in each of the plurality of contact holes to provide electrical connections to the plurality of conductive layers.

5. The method of claim 1, wherein a thickness at the center of the second photoresist pattern is substantially equal to a thickness of the stack structure.

6. The method of claim 1, wherein an etch selectivity of the plurality of dielectric layers is different from an etch selectivity of the plurality of conductive layers.

7. A method of fabricating a semiconductor device, the method comprising:
    alternately stacking a plurality of dielectric layers and a plurality of sacrificial layers on a semiconductor substrate to form a mold structure;
    forming a multi-cell transistor which is connected vertically in the mold structure;
    forming a first photoresist pattern on the mold structure;
    forming a second photoresist pattern whose thickness is reduced as the second photoresist pattern extends from the center of the mold structure to a periphery of the mold structure by performing a heat treatment on the first photoresist pattern;
    etching the mold structure through the second photoresist pattern to form a slope profile on the mold structure whose thickness is reduced as the slop profile extends from the center of the mold structure towards the periphery of the mold structure; and
    forming a step-type profile along the periphery of the mold structure by selectively etching the dielectric layer.

8. The method of claim 7, wherein the second photoresist pattern is formed by a reflow process of the first photoresist pattern.

9. The method of claim 7, wherein forming the cell transistor includes:
    forming a plurality of semiconductor patterns that penetrate the mold structure and extend in a vertical direction to the semiconductor substrate; and
    forming a plurality of gate electrodes that each contact the plurality of semiconductor patterns and that are stacked in the vertical direction to the semiconductor substrate.

10. The method of claim 9, further comprising:
    forming a passivation layer on the mold structure;
    forming a plurality of contact holes in the passivation layer that respectively connect to each of the plurality of gate electrodes; and
    forming metal interconnections in each of the plurality of contact holes.

11. The method of claim 10, wherein the plurality of contact holes expose an end part of each of the plurality of gate electrodes.

12. The method of claim 9, wherein forming the plurality of semiconductor patterns includes forming a first open area that penetrates the mold structure and filling the first open area with a single crystal silicon.

13. The method of claim 9, wherein forming the gate electrode includes:
    forming a second open area which exposes a part of the mold structure between the plurality of semiconductor patterns;

forming a plurality of hollow portions which expose a side of each of the plurality of semiconductor patterns by removing the plurality of sacrificial layers having been exposed by the second open area;

forming a conductive layer that fills the second open area and the plurality of hollow portions; and forming a third open area by removing the conductive layer disposed within the second open area.

14. The method of claim 13, further comprising forming a charge storage layer along surfaces of each of the plurality of dielectric layers exposed by the removal of the plurality of sacrificial layers and along the side of each of the plurality of semiconductor patterns exposed by the plurality of hollow portions prior to the formation of the conductive layer.

15. The method of claim 13, further comprising filling the third open area with a dielectric material.

16. The method of claim 7, wherein the semiconductor device is a vertical nonvolatile memory device.

17. A method of fabricating a semiconductor device, the method comprising:

forming a dielectric layer and a conductive layer on a substrate to form a stack structure;

forming a first photoresist pattern on the stack structure;

performing a heat treatment on the first photoresist pattern;

etching the stack structure through the heat treated first photoresist pattern to form a slope profile on the stack structure having a thickness that decreases as the slope profile extends outward from a center of the stack structure towards a periphery of the stacked structure; and forming a step-type profile along the periphery of the stack structure by selectively etching the dielectric layer.

18. The method of claim 17, wherein the heat treated first photoresist pattern has a thickness that decreases as a distance from a center of the heat treated first photoresist pattern increases.

19. The method of claim 18, wherein the heat treated first photoresist pattern contacts a greater surface area of the stack structure than the first photoresist pattern.

20. The method of claim 17, wherein the dielectric layer includes a plurality of dielectric layers and the conductive layer includes a plurality of conductive layers, and the plurality of dielectric layers and the plurality of conductive layers are alternately stacked on the substrate to form the stack structure.

* * * * *